(12) United States Patent
Ji

(10) Patent No.: US 8,455,339 B2
(45) Date of Patent: Jun. 4, 2013

(54) METHOD FOR FABRICATING SEMICONDUCTOR DEVICE WITH SIDE JUNCTION

(75) Inventor: Yun-Hyuck Ji, Gyeonggi-do (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 0 days.

(21) Appl. No.: 12/960,790

(22) Filed: Dec. 6, 2010

(65) Prior Publication Data
US 2012/0009748 A1 Jan. 12, 2012

(30) Foreign Application Priority Data
Jul. 7, 2010 (KR) .................. 10-2010-0065443

(51) Int. Cl.
*H01L 21/04* (2006.01)
(52) U.S. Cl.
USPC ........... 438/510; 438/524; 438/542; 257/302
(58) Field of Classification Search
USPC .................. 438/270, 510, 524, 542; 257/302, 257/E21.158, E21.135, E21.328, E27.096, 257/E21.41, E29.183, E29.189, E29.262, 257/E29.274, E29.313, E29.318
See application file for complete search history.

(56) References Cited

U.S. PATENT DOCUMENTS

| | | | |
|---|---|---|---|
| 6,218,236 B1 | 4/2001 | Economikos et al. | |
| 2004/0235282 A1* | 11/2004 | Lee et al. | 438/533 |
| 2006/0097304 A1* | 5/2006 | Yoon et al. | 257/307 |
| 2006/0170057 A1* | 8/2006 | Bae | 257/365 |
| 2007/0190766 A1* | 8/2007 | Seo et al. | 438/585 |
| 2010/0301407 A1* | 12/2010 | Sung | 257/329 |

FOREIGN PATENT DOCUMENTS
KR 1020100071406 6/2010
KR 1020100071407 6/2010

OTHER PUBLICATIONS

Notice of Allowance issued from Korean Intellectual Property Office on Jul. 28, 2011.

* cited by examiner

*Primary Examiner* — Khiem D Nguyen
(74) *Attorney, Agent, or Firm* — IP & T Group LLP

(57) ABSTRACT

A method for fabricating a semiconductor device, including etching a substrate to form a trench, forming a junction region in the substrate under the trench, etching the bottom of the trench to a certain depth to form a side junction, and forming a bit line coupled to the side junction.

22 Claims, 12 Drawing Sheets

METHOD FOR FABRICATING SEMICONDUCTOR DEVICE WITH SIDE JUNCTION

CROSS-REFERENCE TO RELATED APPLICATIONS

The present application claims priority of Korean Patent Application No. 10-2010-0065443, filed on Jul. 7, 2010, which is incorporated herein by reference in its entirety.

BACKGROUND OF THE INVENTION

Exemplary embodiments of the present invention relate to a method for fabricating a semiconductor device, and more particularly, to a method for fabricating a semiconductor device with a side junction region.

In general, a horizontal gate has a horizontal channel. Recently, a vertical gate structure with a vertical channel is being developed to increase a net die. In a DRAM, each cell with a vertical gate structure may include an active region including a body and a pillar, a buried bit line, and a vertical gate (or a vertical word line). Here, the pillar may be a portion of the body. For example, the buried bit line is buried in a trench between the bodies of active regions, and the vertical gate is formed at a sidewall of the pillar of the active region over the buried bit line. The buried bit line may be buried between adjacent active regions, so that two cells are adjacent to one buried bit line. A one-side-contact (OSC) process, which is performed to insulate one of adjacent active regions and form a contact at the other, may be applied to drive one cell per one buried bit line. The OSC process is used to form a junction region at a sidewall of the active region, and the junction region is electrically connected to the buried bit line.

The OSC process is performed to expose a portion of one sidewall of the active region. Thereafter, a dopant is ion-implanted into the portion of the one sidewall of the active region to form the side junction region. Also, an annealing process may be performed to form the side junction region.

SUMMARY OF THE INVENTION

Exemplary embodiments of the present invention are directed to a method for fabricating a semiconductor device with a side junction region.

In accordance with an exemplary embodiment of the present invention, a method for fabricating a semiconductor device includes etching a substrate to form a trench, forming a junction region in the substrate under the trench, etching the bottom of the trench to a certain depth to form a side junction, and forming a bit line coupled to the side junction.

In accordance with another exemplary embodiment of the present invention, a method for fabricating a semiconductor device includes etching a substrate to form a plurality of bodies isolated by a first trench, forming a liner layer that exposes a portion of the bottom surface of the first trench, forming a junction region in the substrate under the exposed bottom surface of the first trench, etching a portion of the junction region to form a side junction with a side exposed by a second trench; and forming a bit line that is connected to the side junction and buries the second trench.

DESCRIPTION OF SPECIFIC EMBODIMENTS

Figure 1:
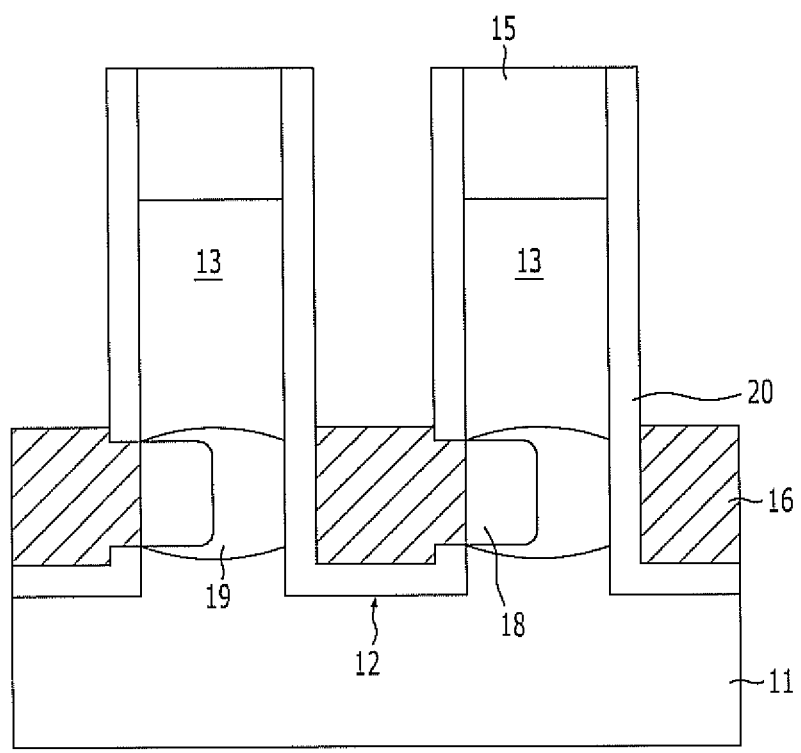
FIG. 1 is a cross-sectional view illustrating a method for forming a side junction by using a doped layer and an annealing process.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

FIG. 1 is a cross-sectional view illustrating a method for forming a side junction region.

Referring to FIG. 1, a plurality of active regions 13 isolated by trenches 12 are formed on a substrate 11. A liner layer 20 is formed on the sidewalls of the active region 13 and on the surface of the trench 12. The liner layer 20 is formed to expose a portion of one sidewall of the active region 13. A hard mask pattern 15 is formed on the active region 13.

In the method of FIG. 1, the side junction region may be formed as follows.

First, a doped layer 16 is formed to gap-fill the trench 12, and a planarization and etch-back process is performed thereon. Here, the doped layer 16 may include a doped polysilicon layer. Then, an annealing process is performed to form a side junction region 18. Further, as a result of forming the side junction region 18, a floating body structure 19 may be formed which electrically isolates the substrate 11 from the active region. FIGS. 2A to 2L are cross-sectional views illustrating a semiconductor device fabricating method in accordance with an exemplary embodiment of the present invention.

Figure 2A:
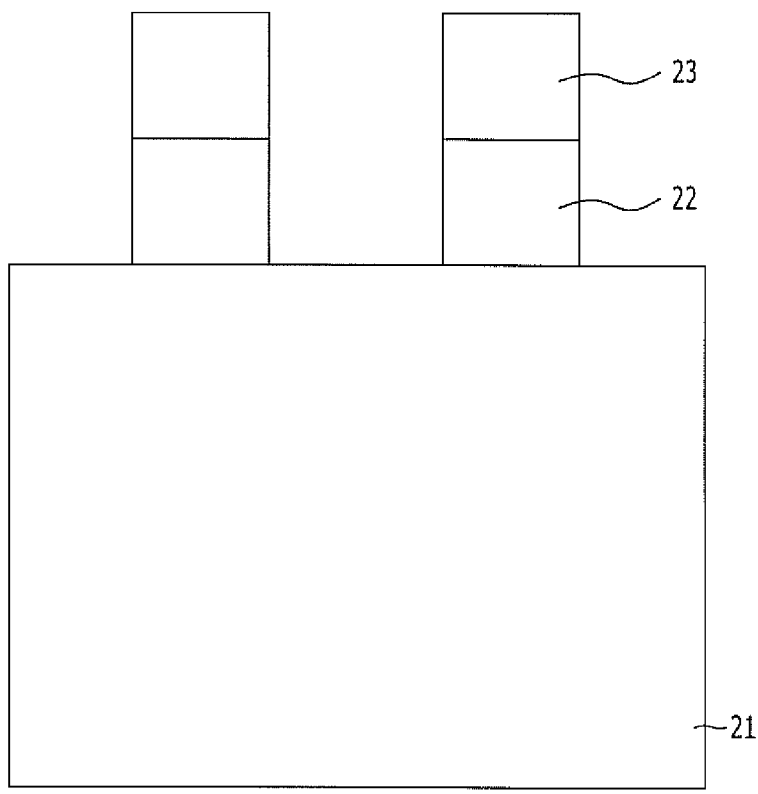
FIGS. 2A to 2L are cross-sectional views illustrating a semiconductor device fabricating method in accordance with an exemplary embodiment of the present invention.

Referring to FIG. 2A, a hard mask pattern 22 is formed on a substrate 21. The substrate 21 may be a silicon substrate. The forming of the hard mask pattern 22 includes forming a hard mask layer and etching the hard mask layer by using a photoresist pattern 23 as an etch barrier. The photoresist pattern 23 may be a line and space pattern, which is characterized by a plurality of parallel, line-shaped structures separated by a space. Also, the photoresist pattern 23 may be stripped using oxygen plasma. The hard mask pattern 22 may be formed of an oxide layer or a nitride layer, or a stack of an oxide layer and a nitride layer. Also, the hard mask pattern 22 may be formed by stacking an amorphous carbon layer and an anti-reflective coating (ARC) layer under the photoresist pattern 23. The ARC layer includes a silicon oxynitride (SiON) layer.

Figure 2B:
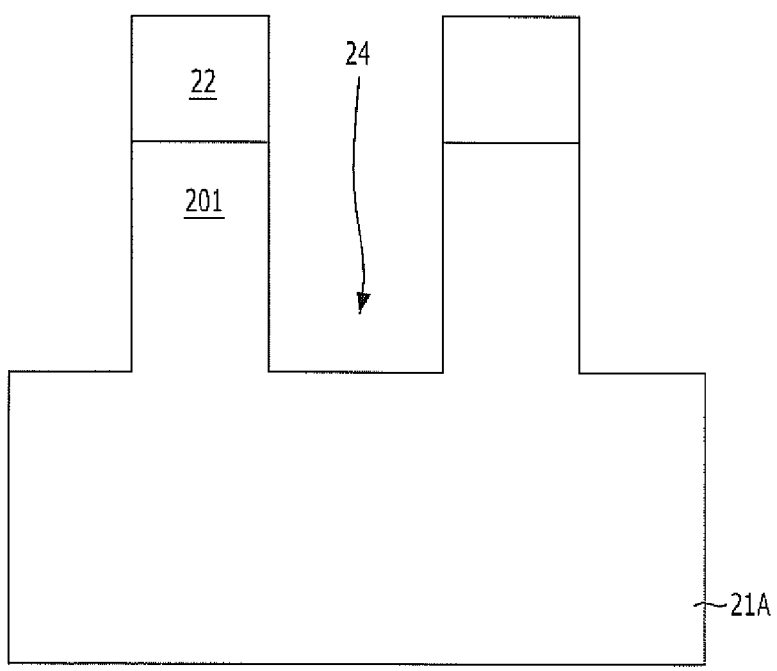

Referring to FIG. 2B, a first etch is performed. For example, using the hard mask pattern 22 as an etch barrier, the substrate 21 is etched to a certain thickness to form first trenches 24 and bodies 201. The resultant etched substrate is designated with reference numeral 21A. Each body 201 is a region for forming a channel, source, and drain of a vertical transistor.

The sidewalls of the body 201 may have a vertical profile. The etch process may be performed through an anisotropic etch process. If the substrate 21 is a silicon substrate, the anisotropic etch process may be performed through a plasma dry etch process using $Cl_2$ gas, HBr gas, or a mixture thereof.

Figure 2C:
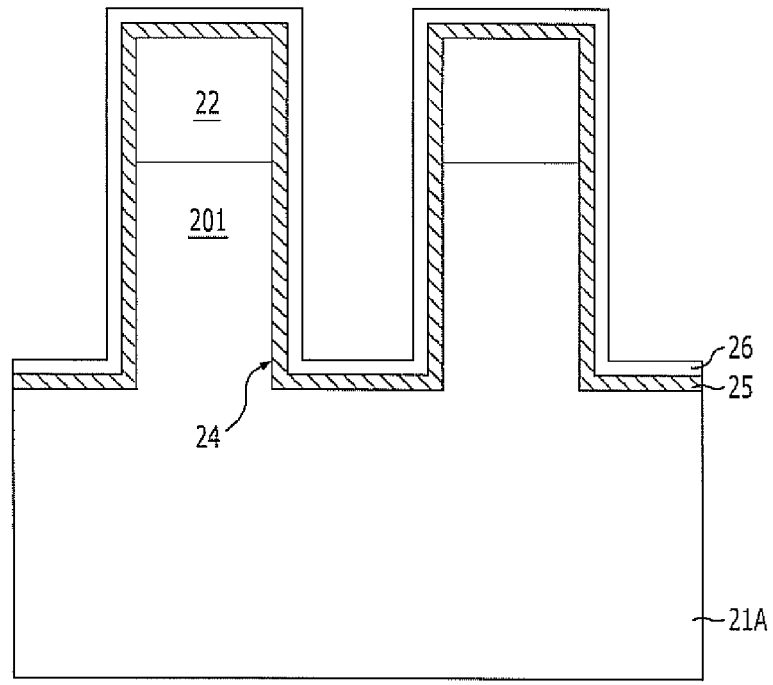

Referring to FIG. 2C, a first liner layer 25 is formed on the entire structure including the body 201. The first liner layer 25 may include a liner nitride layer. The liner nitride layer may include a nitride layer such as a silicon nitride layer. For example, where a silicon nitride layer is used as the first liner layer 25, it may be formed through a chemical vapor deposition (CVD) process. If the silicon nitride layer is formed through the CVD process, it is formed to a thickness of approximately 100 Å or less by reacting $SiH_2Cl_2$ and $NH_3$ at a temperature of approximately 750° C. or less under a pressure of approximately 1.0 Torr or less.

A second liner layer 26 is formed on the first liner layer 25. The second liner layer 26 may include a liner oxide layer. The liner oxide layer may include an oxide layer, such as a silicon oxide layer. The oxide layer used as the second liner layer 26 is an undoped layer. The second liner layer 26 may include an oxide layer formed of Tetra Ethyl Ortho Silicate (TEOS), which is called a TEOS oxide layer. The TEOS oxide layer may be formed through a CVD (Chemical Vapor Deposition) process. If the TEOS oxide layer is formed through the CVD process, it is formed to a thickness of approximately 100 Å or less by reacting TEOS and $O_2$ at a temperature of approximately 700° C. or less under a pressure of approximately 1.0 Torr or less.

Figure 2D:
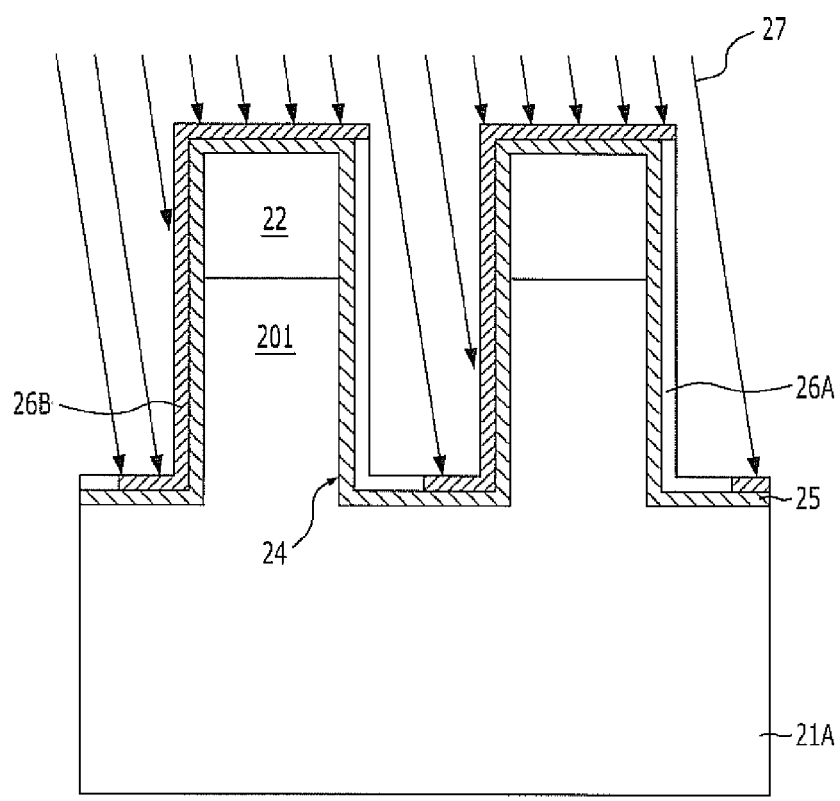

Referring to FIG. 2D, an ion implantation process 27 is performed to ion-implant a dopant. The ion implantation process 27 may be, for example, a tilt ion implantation process, which implants a dopant at a certain tilt angle. Accordingly, the dopant may be implanted into a portion of the second liner layer 26.

Here, the tilt angle may be approximately 5° to approximately 30°. In the ion implantation process 27, a portion of an ion beam is blocked by the hard mask pattern 22. Thus, a portion of the second liner layer 26 is doped, while other portions remain undoped. For is example, the ion-implanted dopant may be a P-type dopant such as boron, and boron difluoride ($BF_2$) may be used as a dopant source for implanting boron ions. When the tilt ion implantation process 27 is performed using boron difluoride ($BF_2$), the ion implantation energy is approximately 5 keV.

As a result of the ion implantation process 27, a portion of the second liner layer 26 remains undoped. For example, as a result of the ion implantation process 27 being performed with a tilted angle, a portion of the second liner layer 26 exposed to the ion beams emitted in the ion implantation process 27 becomes a doped second liner layer 26B. The other portion of the second liner layer 26, which is not exposed to the ion beams, remains as an undoped second liner layer 26A.

As described above, as a result of the ion implantation process 27, the second liner layer 26 is divided into the doped second liner layer 26B and the undoped second liner layer 26A. The doped second liner layer 26B may be damaged due to a lattice breakdown caused by the ion implantation process 27.

Figure 2E:
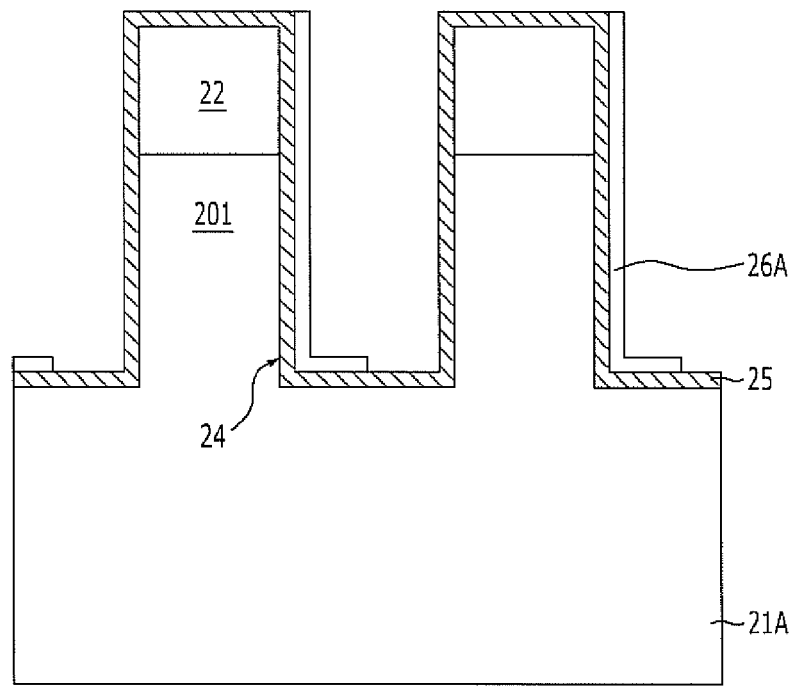

Referring to FIG. 2E, the doped second liner layer 26B is removed. In general, an oxide layer has an etch rate difference in a wet etching process according to whether it is doped or not. That is, an oxide layer with a lattice breakdown caused by doping has a higher wet etch rate.

Thus, because the doped second liner layer 26B has a higher wet etch rate, the doped second liner layer 26B may be removed through a wet etching process or a wet cleaning process without removing the undoped second liner layer 26A. If the doped second liner layer 26B is an oxide layer, it may be removed by a buffered oxide etchant (BOE), including hydrofluoric acid (HF).

The undoped second liner layer 26A remains after the doped second liner layer 26B is removed as described above.

Figure 2F:
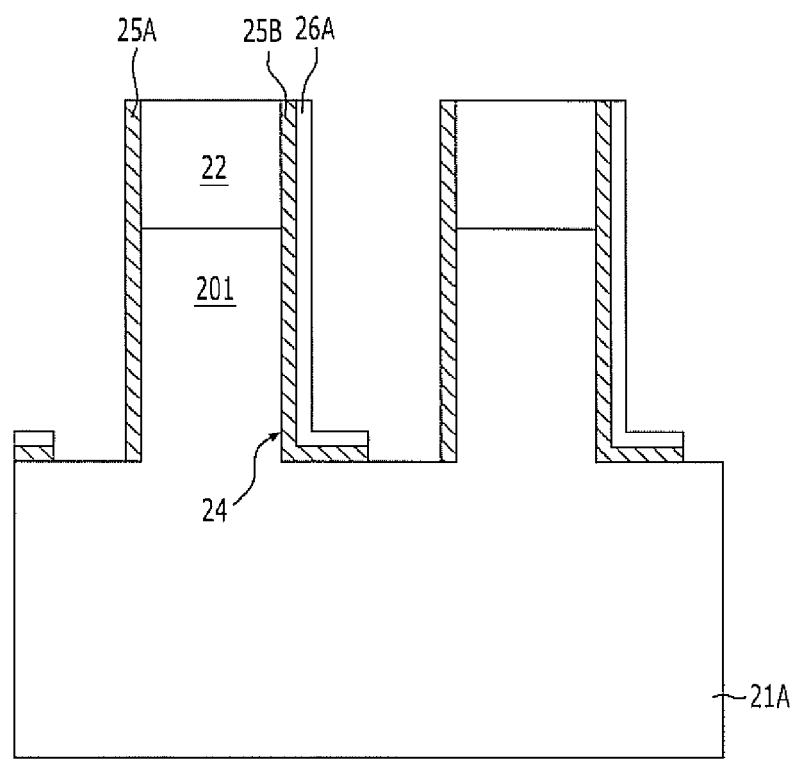

Referring to FIG. 2F, a portion of the first liner layer 25 is removed through a blanket etch process, such as an etch-back process. Accordingly, a portion of the bottom surface of the first trenches 24 is exposed. The first liner layer 25 remains as represented by reference numerals '25A' and '25B'. More specifically, remaining portions of the first liner layer 25 form a straight spacer 25A at one sidewall of the body 201 and an L-shaped spacer 25B at the other sidewall of the body 201. The L-shaped spacer 25B exposes a corner portion of the bottom surface of the first trench 24. That is, the L-shaped spacer 25B does not cover the entire bottom surface of the first trenches 24.

Figure 2G:
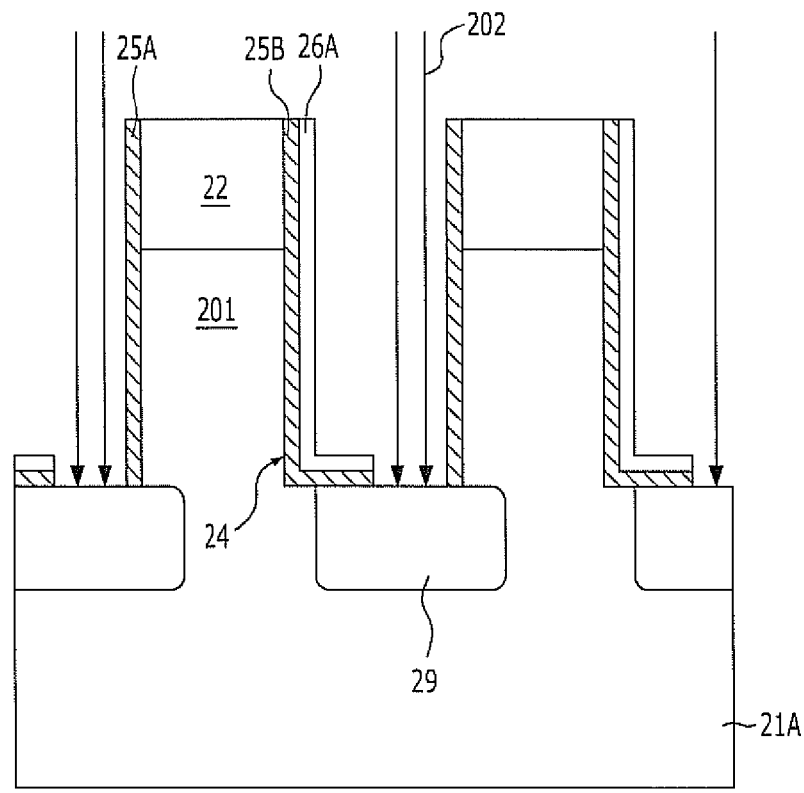

Referring to FIG. 2G, a junction region 29 is formed under a portion of the bottom surface of each of the first trenches 24. The junction region 29 is formed by the diffusion of dopants in the substrate 21A. In particular, the dopants diffuse laterally in the direction of adjacent bodies 201. Accordingly, the junction region 29 extends laterally so that a portion of the junction region 29 is beneath one of the adjacent bodies 201.

In an exemplary embodiment, an annealing process 202 may be performed to form the junction region 29. The annealing process 202 may be performed in a dopant-containing gas atmosphere. The annealing process 202 may include a first annealing process performed in a dopant-containing gas atmosphere, and a second annealing process performed at a higher temperature than the first annealing process.

In another exemplary embodiment, the annealing process is performed to form the junction region 29 after a straight ion implantation process is performed using a dopant.

The annealing process 202 may be one or both of a furnace anneal and a rapid thermal anneal. The annealing process may be performed at a temperature of approximately 700° C. under a pressure of approximately 100 Torr or less, and the dopant may include N-type impurities such as arsenic (As) and phosphor (Ph). For example, a dopant-containing gas, which includes $AsH_3$ and $PH_3$, may be used. The junction region 29 may have a doping concentration of at least $1 \times 10^{20}$ atoms/cm$^3$.

The spacing distance between the junction regions 29 may be secured even when the annealing process is performed. That is, although an annealing process is performed, diffusion does not occur to the extent that adjacent junction regions 29 overlap.

Figure 2H:
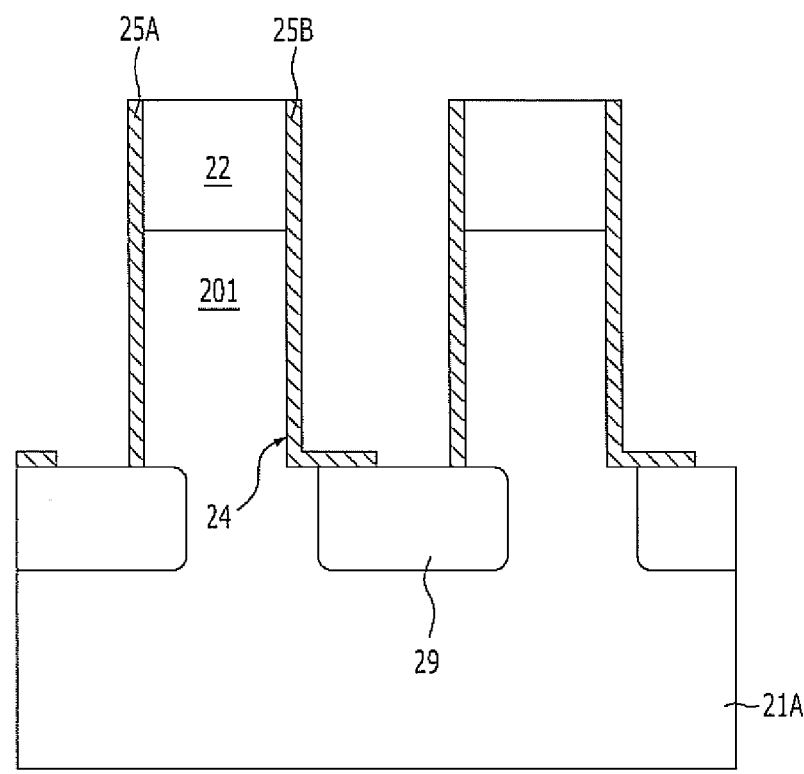

Referring to FIG. 2H, a cleaning process is performed to remove the undoped second liner layer 26A. According to an exemplary embodiment, because the undoped second liner layer 26A is an oxide layer, the cleaning process is performed using hydrofluoric acid (HF) or buffered oxide etchant (BOE) solution. Accordingly, the undoped second liner layer 26A can be removed with minimal damage to the straight spacer 25A and L-shaped spacer 25B, which may be formed of a nitride layer.

Figure 2I:
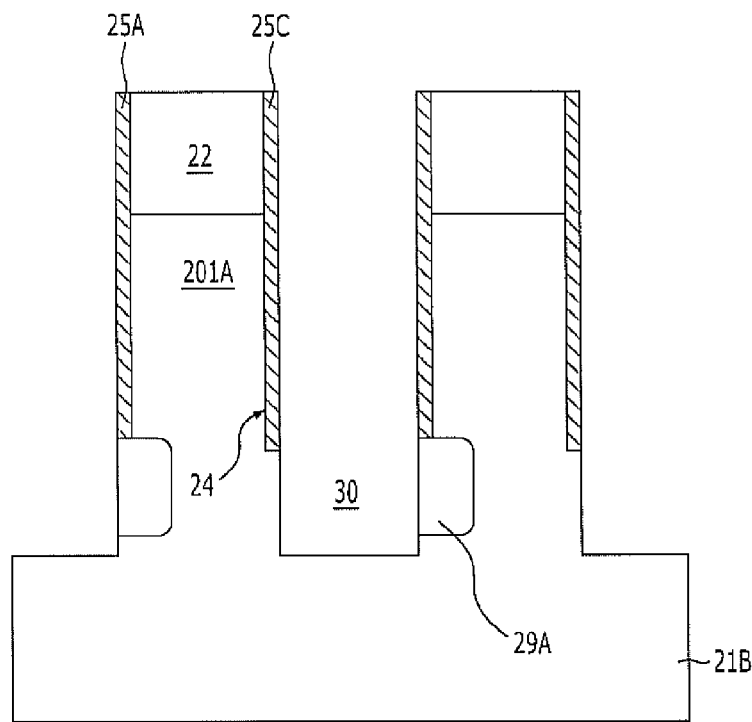

Referring to FIG. 2I, a second etch is performed to form a second trench 30. The substrate 21A is etched so that the second trench 30 has a depth for dividing the junction 29 into a side junction 29A. Accordingly, a side junction region 29A is formed at a sidewall of the second trench 30. Further, a side of the side junction region 29A is exposed by the second etch. Ideally, the side junction region 29A is formed at just one of the sidewalls of the second trench 30. The second etch may be performed through an anisotropic etch process. The anisotropic etch process may be performed through a plasma dry etch process using $Cl_2$ gas, HBr gas, or a mixture thereof. As a result of the second etch, a portion of the L-shaped spacer 25B, which was formed on the bottom surface of the first trench 24 is etched, and thus, the L-shaped spacer becomes a straight spacer 25C.

In forming the above-described second trench 30, the height of the body 201 increases, and the resulting body is represented by reference numeral '201A'. Further, the substrate 21A remaining after the second etch is represented by reference numeral '21B'.

Figure 2J:
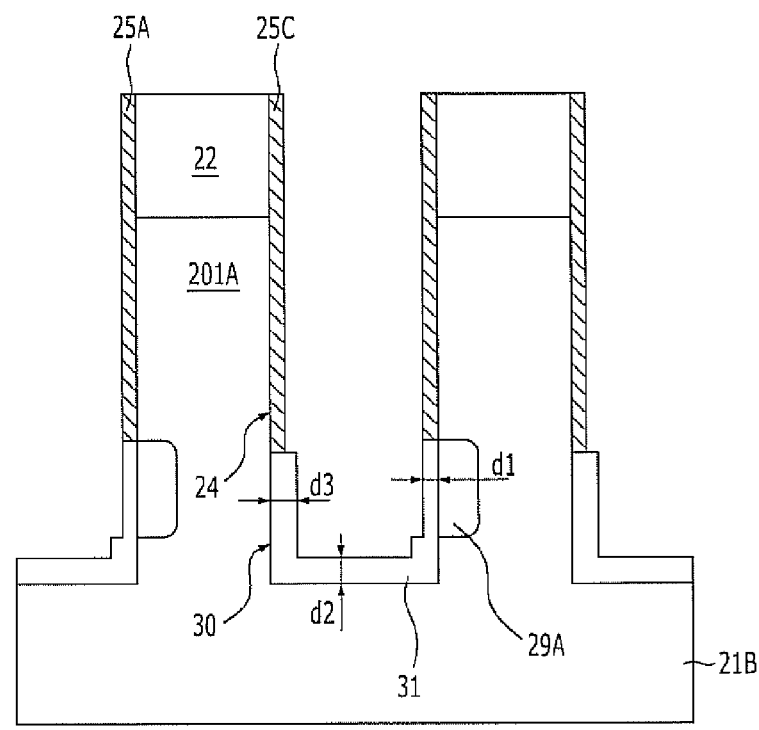

Referring to FIG. 2J, an isolation layer 31 is formed at the surface of the second trench 30. The isolation layer 31 is formed to electrically isolate the bottoms of the adjacent bodies 201A. The isolation layer 31 may include an oxide layer, such as a silicon oxide layer. The isolation layer 31 is formed at the surface of the second trench 30 such that a thickness d1 at the surface of the side junction region 29A is less than thicknesses d2 and d3 at the other surfaces of the second trench 30. The isolation layer 31 may be formed through a plasma oxidation process. By applying, for example, a bottom bias in the plasma oxidation process, the isolation layer 31 is formed thicker at the other surfaces of the second trench 30 where the side junction region 29A is not formed. When the bottom bias is applied, ions may be accelerated by an electric field to travel straight, thus a thickness at the portions where the side junction region 29A is not formed may increase.

According to an exemplary embodiment, the plasma oxidation process may be performed in an oxygen atmosphere under a pressure of approximately 0.1 Torr. Further, the bottom bias may be 100 W. In this case, the thicknesses d2 and d3 are approximately 50 Å, and the thickness d1 is less than 50 Å. The top and the sidewalls of the body 201A are not oxidized in the plasma oxidation process because they are protected by the straight spacers 25A and 25C, which may be formed of a nitride layer.

Figure 2K:
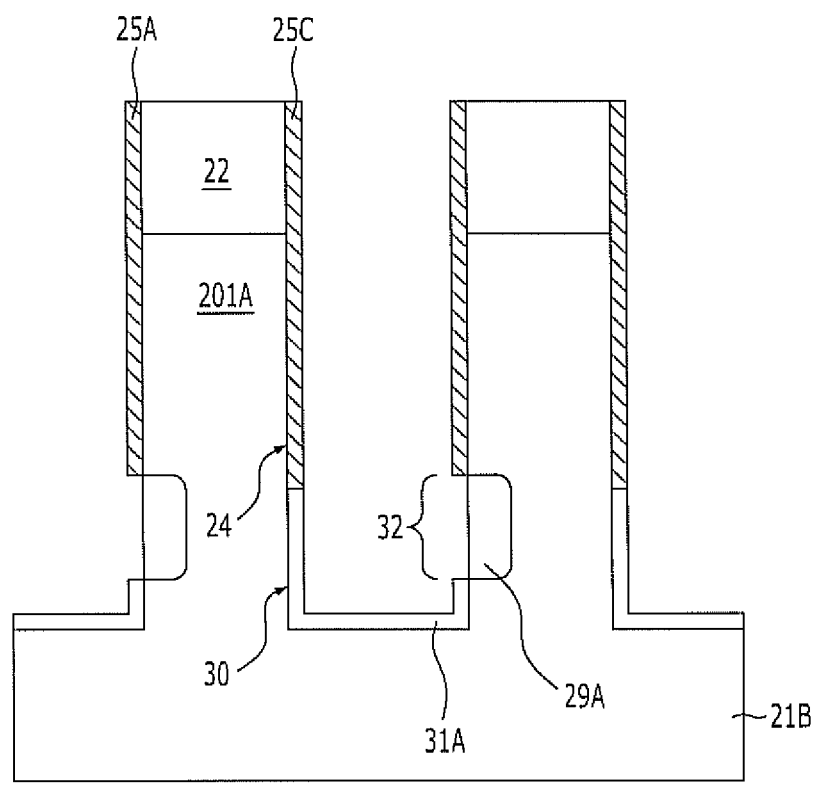

Referring to FIG. 2K, a cleaning process is performed to remove a portion of the isolation layer 31. Accordingly, the side of the side junction region 29A may be exposed. The isolation layer 31 is thinner at the side of the side junction region 29A than the other surfaces of the second trench 30. Therefore, when a cleaning process is performed with a target for exposing the side junction region 29A, an isolation layer pattern 31A remains with a certain thickness at the other surfaces of the second trench 30. Here, an exposed portion of the side junction region 29A is referred to as a side contact 32. The cleaning process may be performed using hydrofluoric acid (HF) or buffered oxide etchant (BOE) solution.

Figure 2L:
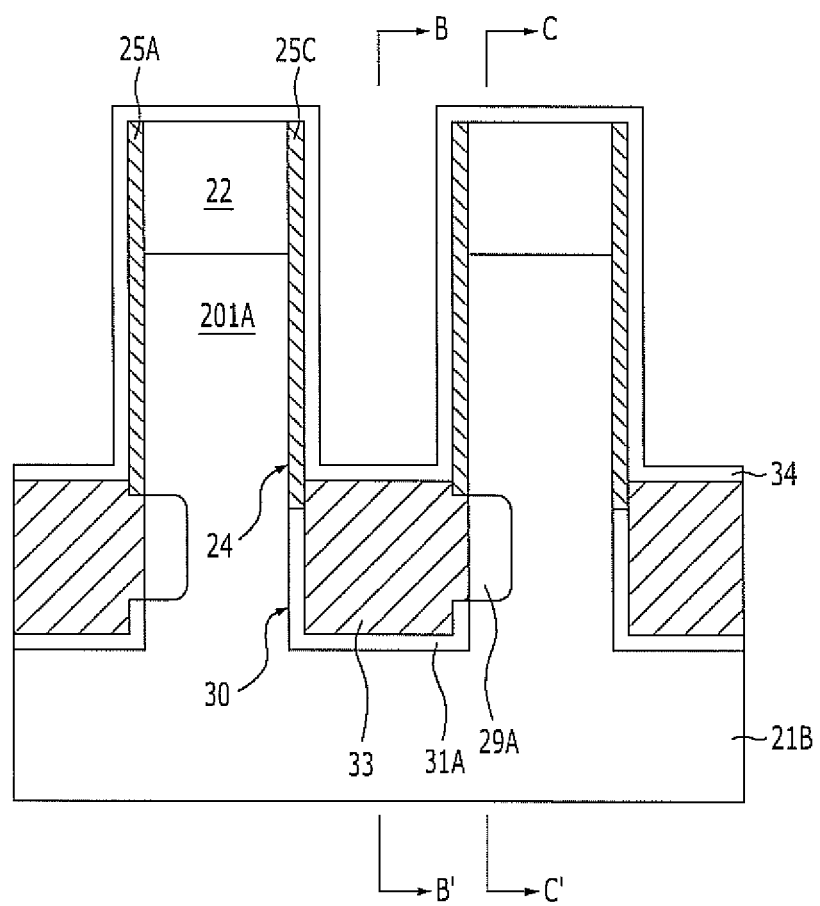

Referring to FIG. 2L, a buried bit line 33 connected to the side junction region 29A is formed. According to an exemplary embodiment, in order to form the buried bit line 33, a bit line conductive layer is gap-filled and the resulting structure is planarized through a chemical mechanical polishing (CMP) process. Thereafter, the bit line conductive layer is etched back to the height contacting the side junction region 29A, thereby forming the buried bit line 33 connected to the side junction region 29A. For example, the buried bit line 33 is formed of a metallic material such as titanium (Ti) and tungsten (W).

Thereafter, a bit line protecting layer 34 may be formed on the entire structure including the buried bit line 33. The bit line protecting layer 34 may include a nitride layer, such as a silicon nitride layer.

Figure 3:
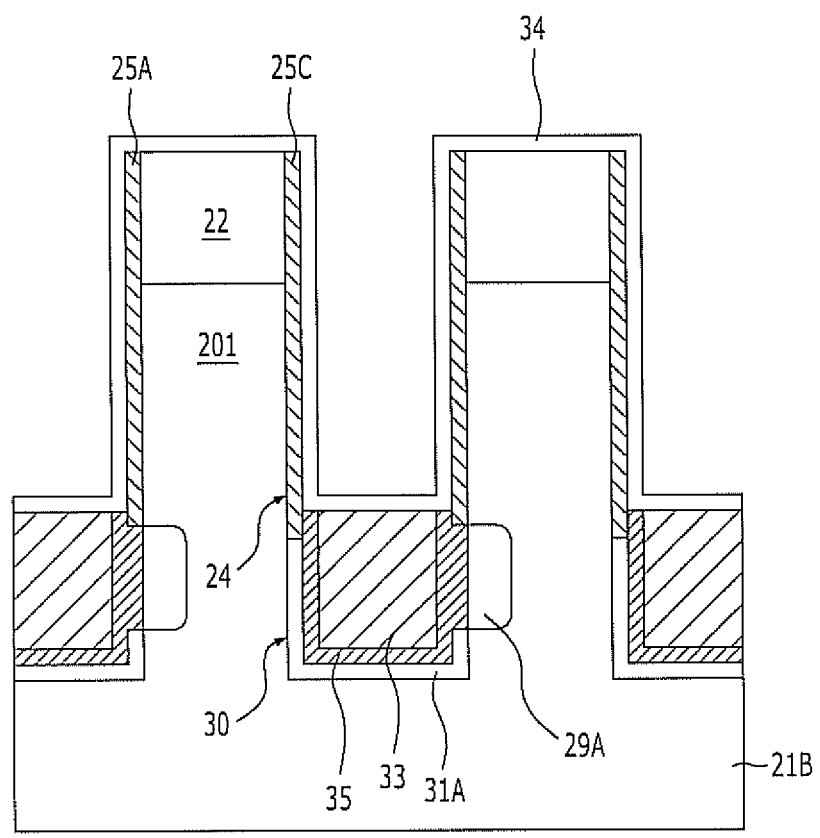
FIG. 3 is a cross-sectional view illustrating another method for forming a buried bit line.

FIG. 3 is a cross-sectional view illustrating another exemplary method for forming a buried bit line. Here, a barrier metal 35 may be formed before the forming of the buried bit line 33. The barrier metal 35 may be formed by stacking a titanium (Ti) layer and a titanium nitride (TiN) layer. The barrier metal 35 may be simultaneously etched back in the etch-back process for forming the buried bit line 33.

FIGS. 4A to 4E are cross-sectional views illustrating a fabricating method after forming a buried bit line, which are taken along lines B-B' and C-C' of FIG. 2L.

Figure 4A:
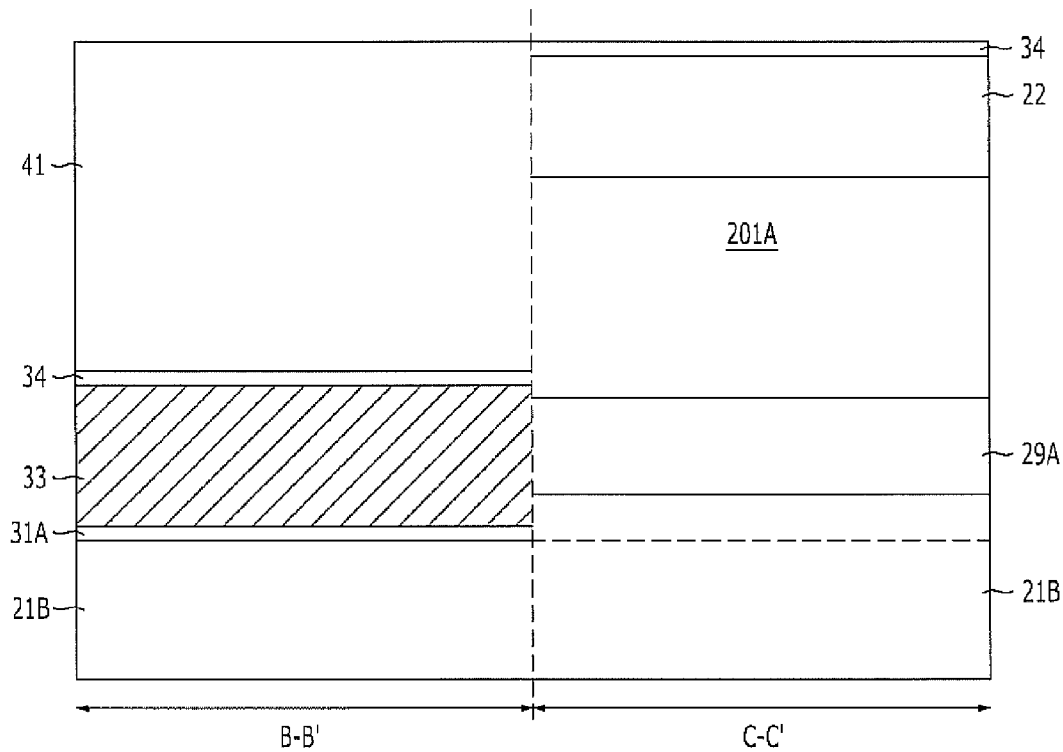
FIGS. 4A to 4E are cross-sectional views illustrating a fabricating method after a buried bit line.

Referring to FIG. 4A, a first dielectric interlayer 41 is formed on the entire structure including the bit line protecting layer 34. Thereafter, the first dielectric interlayer 41 is planarized until the surface of the hard mask pattern 22 is exposed.

Figure 4B:
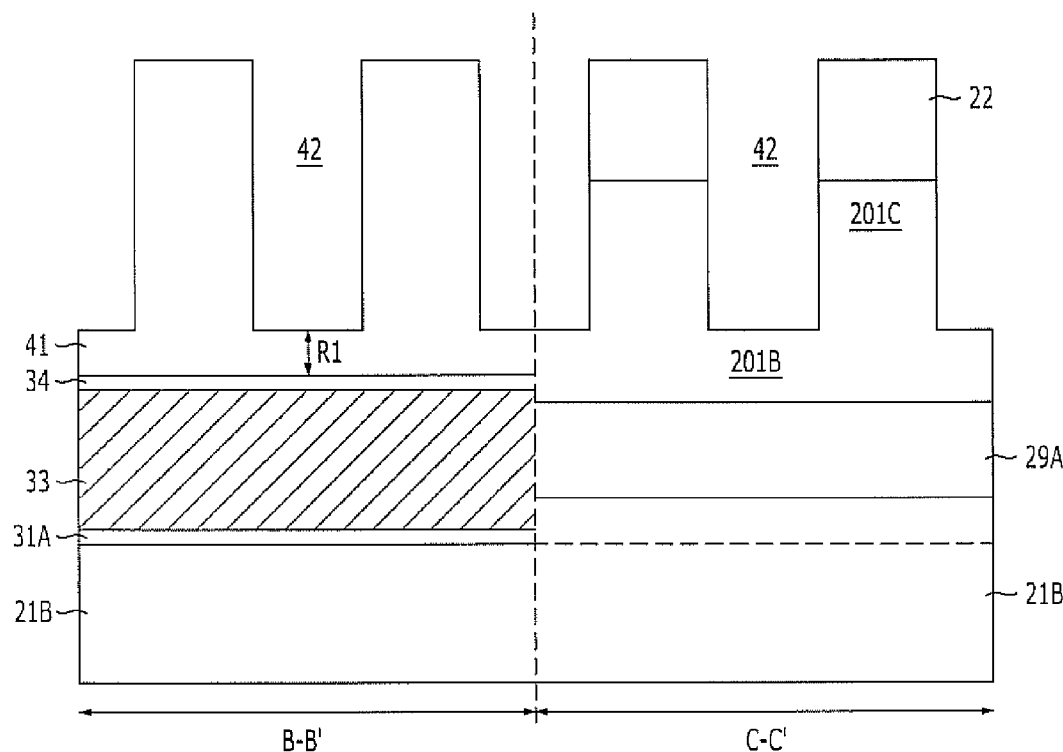

Referring to FIG. 4B, a word line trench 42 is formed using a photoresist pattern (not illustrated). Using the photoresist pattern as an etch barrier, the first dielectric interlayer 41 is etched to a certain thickness. Here, the hard mask pattern 22 and the body 201A are also etched to a certain thickness. Accordingly, a pillar 201C is formed on a body 201B. A body 201B and the pillar 201C constitute an active region. The body 201B is a portion where the side junction region 29A is formed, which has a line shape that extends in the same direction as the buried bit line 33. The pillar 201C is arranged vertically on the body 201B. The pillar 201C is formed for each cell. The remaining thickness R1 of the first dielectric interlayer 41 serves as an isolation layer between the buried bit line 33 and a vertical word line.

Figure 4C:
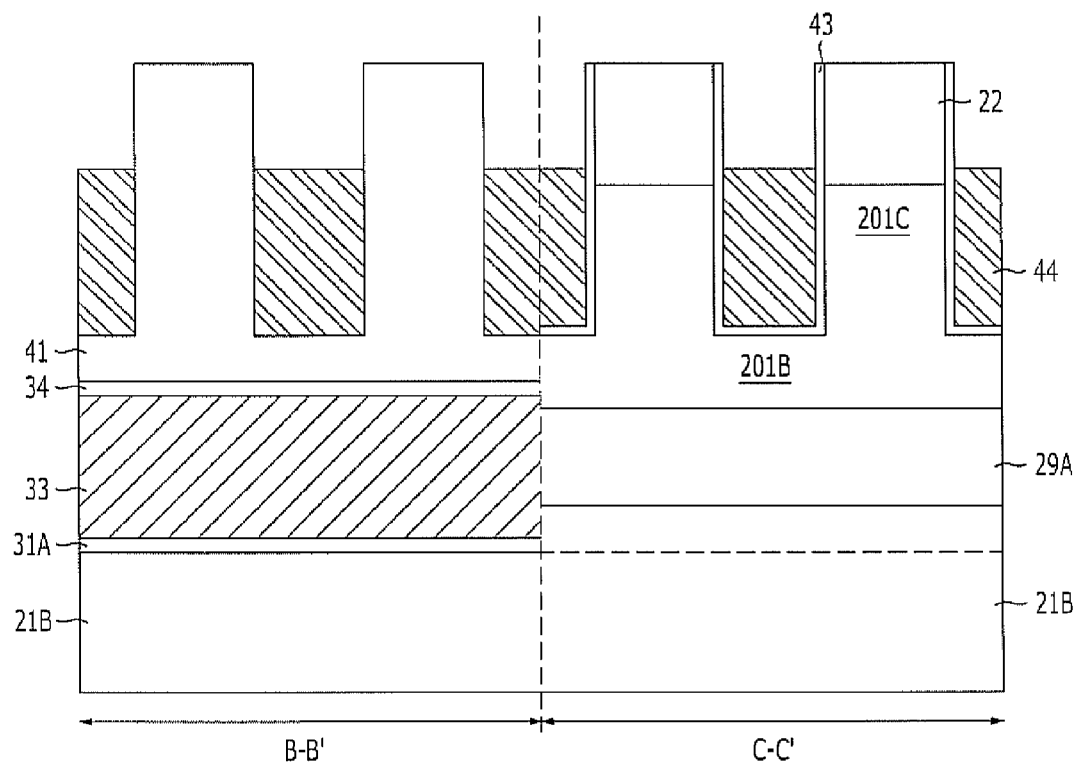

Referring to FIG. 4C, a word line conductive layer 44 is formed to gap-fill the word line trench 42 of FIG. 4B. Thereafter, a planarization and etch-back process may be performed. Furthermore, a gate insulating layer 43 is formed before the forming of the word line conductive layer 44.

Figure 4D:
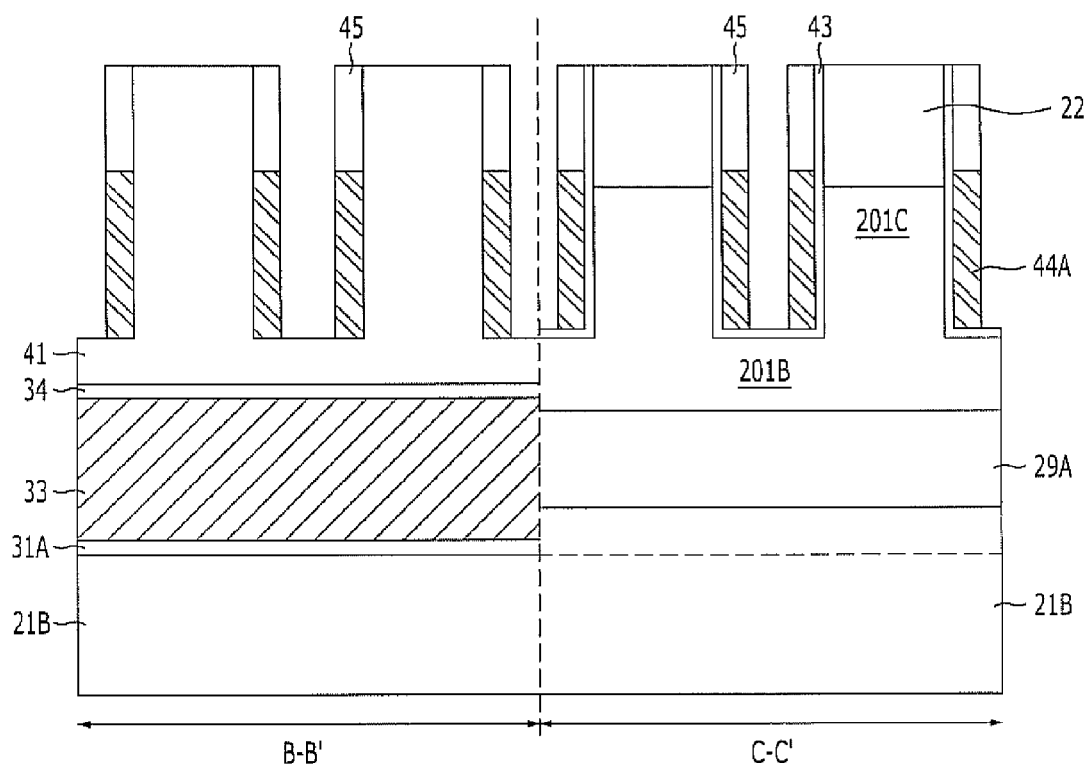

Referring to FIG. 4D, a nitride layer is formed and an etch-back process is performed to form a spacer 45. Using the spacer 45 as an etch barrier, the word line conductive layer 44 is etched to form a vertical word line 44A adjacent to the sidewall of the pillar 201C. The vertical word line 44A serves also as a vertical gate. In another exemplary embodiment, a ring-shaped vertical gate is formed to enclose the pillar 201C, and then a vertical word line 44A is formed to connect the adjacent vertical gates to each other. The vertical word line 44A is formed to intersect the buried bit line 33.

Figure 4E:
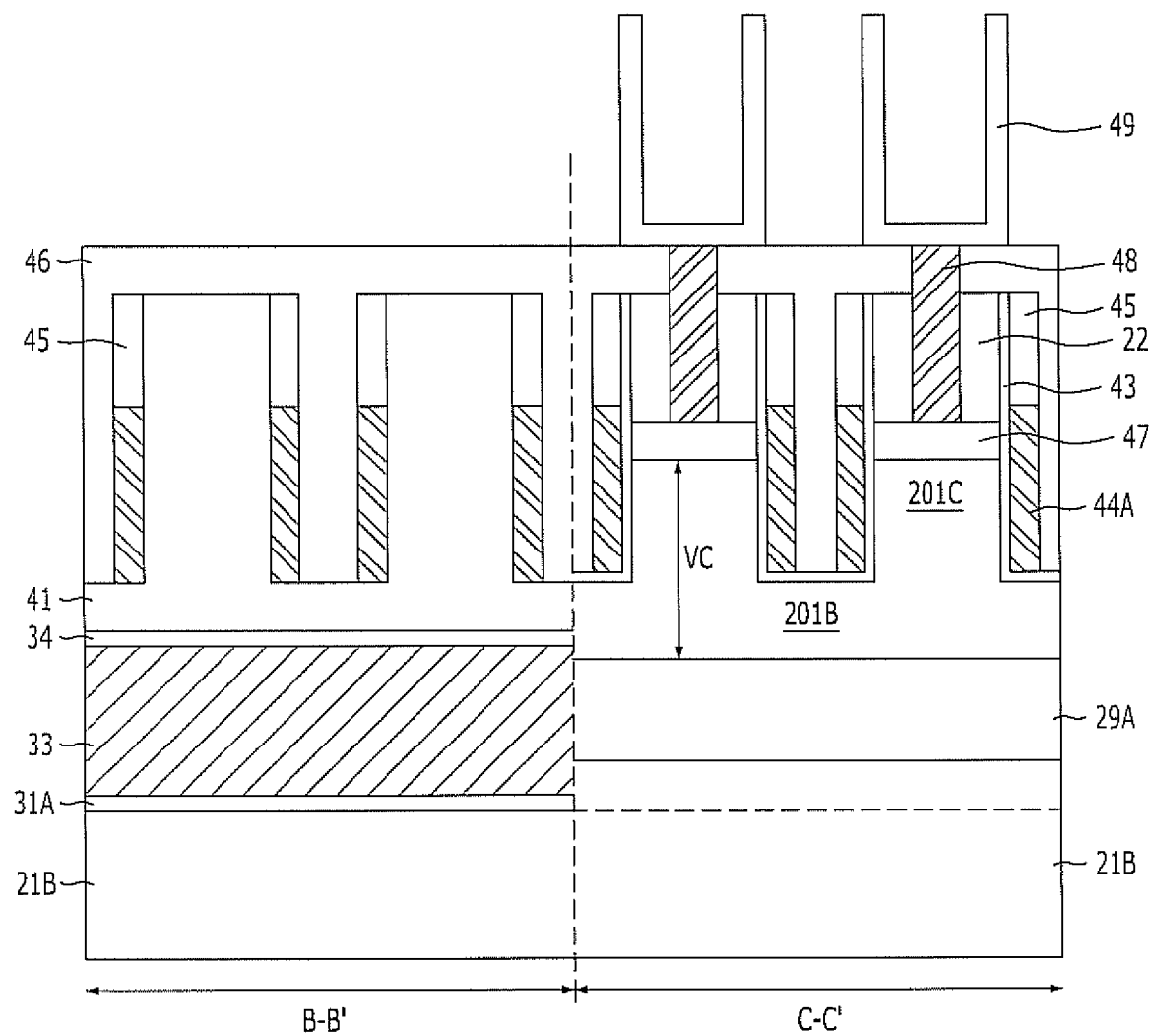

Referring to FIG. 4E, a second dielectric interlayer 46 is formed on the entire structure including the vertical word line 44A.

A storage node contact etch is performed to expose the top of the pillar 201C. Thereafter, a storage node contact (SNC) plug 48 is formed. An ion implantation may be performed to form a source/drain 47, before the forming of the storage node contact plug 48. A vertical channel is formed by the vertical word line 44A between the side junction region 29B and the source/drain 47.

A storage node 49 is formed on the storage node contact plug 48. The storage node 49 may be cylindrical. In another exemplary embodiment, the storage node 49 may have a pillar or concave shape. Thereafter, a dielectric layer and a top electrode are formed.

As descried above, the present invention performs two trench etch processes and performs a side contact forming process and a side junction region forming process between the two trench etch processes, thereby reducing the development cost by process simplification.

Also, the present invention forms a side junction region through a first trench etch, an annealing process, and a second trench etch. Therefore, a body-tied structure may be stably formed, and a floating body structure may be suppressed. Accordingly, a threshold voltage reduction phenomenon can be suppressed, and the off-state characteristics of semiconductor devices can be improved.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
   etching a substrate to form a trench defined by a pair of sidewalls;
   forming a junction region in the substrate under the trench, so that with respect to a bottom of the trench, the junction region is off-centered toward a bottom corner of the trench;
   etching the substrate to a certain depth penetrating through the junction region to form a side junction located in one sidewall of the pair of sidewalls; and
   forming, in the trench and adjacent to the side junction, a bit line coupled to the side junction, the bit line being formed after the forming of the side junction.

2. The method of claim 1, wherein forming the junction region further comprises:
   diffusing a dopant into a portion of the substrate that defines the bottom of the trench.

3. The method of claim 1, wherein forming the junction region further comprises:
   performing an annealing process in a dopant-containing gas atmosphere.

4. The method of claim 1, wherein forming of the junction region further comprises:
   performing a first annealing process in a dopant-containing gas atmosphere; and
   performing a second annealing process at a higher temperature than the first annealing process.

5. The method of claim 1, wherein forming the junction region further comprises:
   implanting a dopant into a portion of the substrate that defines the bottom of the trench; and
   performing an annealing process.

6. The method of claim 3, wherein the dopant includes an N-type impurity.

7. A method for fabricating a semiconductor device, the method comprising:
   etching a substrate to form a first trench that isolates a plurality of bodies that define the first trench;
   forming, in the trench, a liner layer that partially exposes a portion of the substrate that defines a bottom surface of the first trench, where with respect to the portion of the substrate that defines a bottom surface of the first trench, the partially exposed portion of the substrate, is off-centered toward a bottom corner of the first trench;
   after forming the liner layer, forming a junction region under the first trench in the partially exposed portion of the substrate;
   etching a portion of the junction region to form a second trench, defined by the plurality of bodies, and a side junction, where the side junction is located in one of the plurality of bodies; and
   forming, after the forming of the side junction, a bit line that is connected to the side junction and buries the second trench.

8. The method of claim 7, wherein forming the liner layer further comprises:
   forming a liner nitride layer over the entire structure including the first trench;
   forming a liner oxide layer, divided into a doped region and an undoped region, over the liner nitride layer;
   removing the doped region of the liner oxide layer to expose a portion of the liner nitride layer; and
   removing the exposed portion of the liner nitride layer to expose the portion of the substrate that defines the bottom surface of the first trench.

9. The method of claim 8, wherein forming the liner oxide layer further comprises:
   forming an oxide layer; and
   implanting a dopant into a portion of the oxide layer through a tilted ion implantation process.

10. The method of claim 8, wherein the liner oxide layer includes a TEOS (Tetra Ethyl Ortho Silicate) oxide layer.

11. The method of claim 8, wherein removing the doped region of the liner oxide layer comprises a wet etching process.

12. The method of claim 7, further comprising:
    forming an isolation layer over a surface of the plurality of bodies that define the second trench and over the junction region.

13. The method of claim 12, wherein forming the isolation layer comprises:
    forming an oxide layer over the surface of the plurality of bodies that define second trench, and over the function region, where a thickness of the oxide layer formed over the junction region less than thickness of the oxide layer formed over a remainder of surface of the plurality of bodies that define the second trench; and
    removing, through a cleaning process, a portion of the oxide layer to expose the junction region.

14. The method of claim 13, wherein forming the oxide layer comprises a plasma oxidation process.

15. The method of claim 14, wherein the thickness difference is caused by applying a bottom bias during the plasma oxidation process.

16. The method of claim 7, wherein forming the junction region comprises diffusing a dopant into the portion of the substrate that defines the bottom surface of the first trench.

17. The method of claim 7, further comprising:
    after forming of the bit line, etching tops of the plurality of bodies body to form a plurality of pillars; and
    forming a vertical word line over a sidewall of each of the plurality of pillars.

18. The method of claim 7, wherein the plurality of bodies is made of silicon.

19. The method of claim 7, wherein forming the junction region comprises performing an annealing process in a dopant-containing gas atmosphere.

20. The method of claim 7, wherein forming the junction region comprises:
    performing a first annealing process in a dopant-containing gas atmosphere; and
    performing a second annealing process at a higher temperature than the first annealing process.

21. The method of claim 7, wherein forming the junction region comprises:
    implanting a dopant into the portion of the substrate that defines the bottom surface of the first trench; and
    performing an annealing process.

22. The method of claim 19, wherein the dopant includes an N-type impurity.

\* \* \* \* \*